United States Patent
Wada et al.

(10) Patent No.: US 6,873,047 B2
(45) Date of Patent: Mar. 29, 2005

(54) SEMICONDUCTOR DEVICE AND MANUFACTURING METHOD THEREOF

(75) Inventors: Koichi Wada, Sakata (JP); Tatsuru Namatame, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/789,803

(22) Filed: Feb. 27, 2004

(65) Prior Publication Data

US 2004/0222526 A1 Nov. 11, 2004

(30) Foreign Application Priority Data

Feb. 28, 2003 (JP) .......................................... 2003-054002
Jan. 30, 2004 (JP) .......................................... 2004-023936

(51) Int. Cl.[7] .............................................. H01L 23/48
(52) U.S. Cl. ....................... 257/748; 257/751; 257/774; 438/627; 438/643; 438/617
(58) Field of Search ................. 257/748, 751, 257/774; 438/627, 643, 617

(56) References Cited

U.S. PATENT DOCUMENTS 6,297,563 B1 * 10/2001 Yamaha ...................... 257/781

* cited by examiner

Primary Examiner—Fetsum Abraham
(74) Attorney, Agent, or Firm—Harness, Dickey & Pierce, P.L.C.

(57) ABSTRACT

A method for manufacturing a semiconductor device is provided including: a step of forming a solid barrier metal layer on an interlayer insulating film; a removing step of removing at least a part of the solid barrier metal layer located at a place at which a pad opening portion is to be formed; a step of forming a solid second Al alloy film on the interlayer insulating film exposed in the removing step described above and the solid barrier metal layer; a step of patterning the solid second Al alloy film and the solid barrier metal layer so as to form a bonding pad portion on the interlayer insulating film; a step of forming a passivation film on the bonding pad portion and the interlayer insulating film; and a step of forming the pad opening portion in the passivation film at a position located on the bonding pad portion.

15 Claims, 16 Drawing Sheets

SEMICONDUCTOR DEVICE AND MANUFACTURING METHOD THEREOF

RELATED APPLICATIONS

This application claims priority to Japanese Patent Application Nos. 2003-054002 filed Feb. 28, 2003 and 2004-023936 filed Jan. 30, 2004 which are hereby expressly incorporated by reference herein in their entireties.

BACKGROUND

1. Technical Field of the Invention

The present invention relates to semiconductor devices and manufacturing methods thereof, and more particularly, relates to a semiconductor device and a manufacturing method thereof, in which pad peeling of a bonding pad portion is suppressed.

2. Description of the Related Art

FIG. 16 is a cross-sectional view showing a conventional semiconductor device. This semiconductor device has bonding pad portions.

On a silicon substrate not shown in the figure, an insulating film 101 is formed, and on this insulating film 101, a Ti film 102 is deposited by sputtering, followed by deposition of a TiN film 103 thereon by sputtering. A barrier metal layer 104 made of the Ti film 102 and the TiN film 103 is formed on the insulating film 101.

Next, on this barrier metal 104, a first Al alloy film 105 is formed by sputtering, and an antireflection film 106 made of a TiN film is then formed thereon. Subsequently, the antireflection film 106, the first Al alloy film 105, and the barrier metal layer 104 are patterned. Accordingly, on the insulating film 101, first Al alloy wires 107a and 107b are formed.

Next, an interlayer insulating film 108 made of an oxide film is formed over the first Al alloy wires 107a and 107b. Subsequently, by etching this interlayer insulating film 108, via holes are formed therein at positions located on the first Al alloy wires 107a and 107b. Next, after a Ti film 112 is deposited inside the via holes and on the interlayer insulating film by sputtering, a TiN film 113 is formed on this Ti film 112 by sputtering. As described above, inside the via holes and on the interlayer insulating film 108, a barrier metal layer 114 made of the Ti film 112 and the TiN film 113 is formed.

Then, on the barrier metal layer 114 and inside the via holes, a W film is deposited by a CVD (chemical vapor deposition) method. After the W film present on the interlayer insulating film 108 is removed by etching (etch-back), a W plug 109 is buried in each via hole formed in the interlayer insulating film 108.

Next, over the entire surface including the W plugs 109, a second Al alloy film 115 is deposited by sputtering, and an antireflection film 116 made of a TiN film is formed thereon. The antireflection film 116, the second Al alloy film 115, and the barrier metal layer 114 are then patterned. Accordingly, on the interlayer insulating film 108, a bonding pad portion 117a and a second Al alloy wire 117b are formed. The bonding pad portion 117a is electrically connected to the first Al alloy wire 107a via the W plug 109, and the second Al alloy wire 117b is electrically connected to the first Al alloy wire 107b via the W plug 109.

Subsequently, over the entire surface including the bonding pad portion 117a and the second Al alloy wire 117b, a passivation film 110 made of a silicon nitride film or the like is deposited by a CVD method. Next, by etching the passivation film 110, an opening portion is formed in the passivation film at a position located on the bonding pad portion 117a. A polyimide film 111 is then formed on the passivation film 110, and an opening portion is formed in this polyimide film 111 at a position located on the aforementioned opening portion. As described above, a pad opening portion for bonding is formed for the bonding pad portion 117a. Through this pad opening portion, the bonding pad portion 117a is exposed.

When a wire is bonded to the bonding pad portion 117a, a stress is applied thereto which is generated by this bonding connection, and due to this stress, peeling of the bonding pad portion 117a may occur in some cases. This peeling of the bonding pad portion 117a is caused by peeling which occurs at the interface between the Ti film 112 of the barrier metal layer and the interlayer insulating film (oxide film) 108. The reason for this is that since a vulnerable alloy layer which has poor stress resistance is formed at the interface between the oxide layer and the Ti film 112, when bonding connection is performed for the bonding pad portion 117a, this vulnerable layer is destroyed by a stress generated in the bonding connection. As a result, peeling of the bonding pad portion occurs.

In consideration of the situations described above, the present invention was made, and an object of the present invention is to provide a semiconductor device and a manufacturing method thereof, in which peeling of the bonding pad portion is suppressed.

SUMMARY

To achieve the object described above, a semiconductor device of the present invention comprises: a bonding pad portion provided on an insulating film; a passivation film provided on the bonding pad portion and the insulating film; and a pad opening portion provided in the passivation film at a position located on the bonding pad portion, wherein the bonding pad portion has a barrier metal layer and a conductive film formed on the barrier metal layer, and at least a part of the barrier metal layer located under the pad opening portion and between the insulating film and the conductive film is removed.

A semiconductor device according to the present invention, comprises: an insulating film provided on a wire; a connecting hole provided in the insulating film at a position located on the wire; a barrier metal layer provided in the connecting hole and on the insulating film; a metal plug provided on the barrier metal layer in the connecting hole; a conductive film provided on the metal plug and the barrier metal layer, the conductive film and the barrier metal layer forming a bonding pad portion; a passivation film provided on the bonding pad portion and the insulating film; and a pad opening portion provided in the passivation film at a position located on the bonding pad portion, wherein at least a part of the barrier metal layer located under the pad opening portion and between the insulating film and the conductive film is removed.

In addition, in the semiconductor device according to the present invention, the pad opening portion may be located at a position other than over the metal plug.

A semiconductor device according to the present invention, comprising: an insulating film provided on a wire; a connecting hole provided in the insulating film at a position located on the wire; a barrier metal layer provided in the connecting hole and on the insulating film; a sidewall provided on the inside surface of the connecting hole with the barrier metal layer provided therebetween; a conductive film provided on the sidewall, in the connecting hole, and on the barrier metal layer, the conductive film and the barrier metal layer forming a bonding pad portion; a passivation film provided on the bonding pad portion and the insulating film; and a pad opening portion provided in the passivation film at a position located on the bonding pad portion, wherein the bonding pad portion is electrically connected to the wire via the conductive film, the sidewall, and the barrier metal layer, which are provided in the connecting hole, and at least a part of the barrier metal layer located under the pad opening portion and between the insulating film and the conductive film is removed.

In the semiconductor device according to the present invention, the barrier metal layer preferably comprises a Ti film and a TiN film provided thereon.

In addition, in the semiconductor device according to the present invention, as the insulating film, a film made of a material comprising Si is preferable.

A method for manufacturing a semiconductor device, according to the present invention, comprises: a step of forming a barrier metal layer on an insulating film; a removing step of removing at least a part of the barrier metal layer located under a position at which a pad opening portion is to be formed; a step of forming a conductive film on the insulating film exposed by the removing step and the barrier metal layer; a step of patterning the conductive film and the barrier metal layer so as to form a bonding pad portion on the insulating film; a step of forming a passivation film on the bonding pad portion and the insulating film; and a step of forming the pad opening portion in the passivation film at a position located on the bonding pad portion.

According to the method for manufacturing a semiconductor device, described above, in the removing step of removing at least a part of the barrier metal layer located under the position at which the pad opening portion is to be formed, the barrier metal layer is removed that is located under the position described above and on the insulating film. Accordingly, at the position at which the barrier metal layer is removed, the formation of a vulnerable alloy layer having poor stress resistance at the interface between the barrier metal layer and the insulating film can be suppressed. Hence, when a wire is bonded to the bonding pad portion by bonding connection, even if a stress caused by this bonding connection is applied to the bonding pad portion, the peeling thereof caused by this stress can be suppressed.

A method for manufacturing a semiconductor device, according to the present invention, comprises: a step of forming an insulating film on a wire; a step of forming a connecting hole in the insulating film at a position located on the wire; a step of forming a barrier metal layer in the connecting hole and on the insulating film; a step of forming a metal film on the barrier metal layer and in the connecting hole; a step of forming a metal plug in the connecting hole by removing the metal film present above the insulating film; a removing step of removing at least a part of the barrier metal layer located under a position at which a pad opening portion is to be formed; a step of forming a conductive film on the insulating film exposed by the removing step, the barrier metal layer, and the metal plug; a step of patterning the conductive film and the barrier metal layer so as to form a bonding pad portion on the insulating film; a step of forming a passivation film on the bonding pad portion and the insulating film; and a step of forming the pad opening portion in the passivation film at a position located on the bonding pad portion.

According to the method for manufacturing a semiconductor device, described above, in the removing step of removing at least a part of the barrier metal layer located under the position at which the pad opening portion is to be formed, the barrier metal layer is removed that is located under the position described above and on the insulating film. Accordingly, at the position at which the barrier metal layer is removed, the formation of a vulnerable alloy layer having poor stress resistance at the interface between the barrier metal layer and the insulating film can be suppressed. Hence, the peeling of the bonding pad portion caused by this stress can be suppressed.

A method for manufacturing a semiconductor device, according to the present invention, comprises: a step of forming an insulating film on a wire; a step of forming a connecting hole in the insulating film at a position located on the wire; a step of forming a barrier metal layer in the connecting hole and on the insulating film; a step of forming a sidewall on the inside surface of the opening portion with the barrier metal layer provided therebetween; a removing step of removing at least a part of the barrier metal layer located under a position at which a pad opening portion is to be formed; a step of forming a conductive film on the insulating film exposed by the removing step, on the barrier metal layer, and in the connecting hole; a step of patterning the conductive film and the barrier metal layer so as to form a bonding pad portion on the insulating film; a step of forming a passivation film on the bonding pad portion and the insulating film; and a step of forming the pad opening portion in the passivation film at a position located on the bonding pad portion.

According to the method for manufacturing a semiconductor device, described above, since the sidewall is formed on the inside surface of the connecting hole, the conductive film can be easily provided in the connecting hole due to the presence of this sidewall. Accordingly, the increase in connection resistance or the generation of connection failures can be suppressed in the connecting hole.

A method for manufacturing a semiconductor device, according to the present invention, comprises: a step of forming an insulating film on a wire; a step of forming a connecting hole in the insulating film at a position located on the wire; a step of forming a barrier metal layer in the connecting hole and on the insulating film; a step of forming a metal film on the barrier metal layer and in the connecting hole; a step of forming a metal plug in the connecting hole by removing the metal film present above the insulating film; a removing step of removing at least a part of the barrier metal layer located under a position at which a pad opening portion is to be formed; a step of forming a conductive film on the insulating film exposed by the removing step, the barrier metal layer, and the metal plug; a step of patterning the conductive film and the barrier metal layer so as to form a bonding pad portion on the insulating film; a step of forming a passivation film on the bonding pad portion and the insulating film; and a step of forming the pad opening portion in the passivation film at a position which is located on the bonding pad portion and which is not located over the metal plug.

According to the method for manufacturing a semiconductor device, described above, since the pad opening portion is not formed over the metal plug, the area of the top surface or the bottom surface of the bonding pad portion can be increased. Hence, the adhesion between the bonding pad portion and the insulating film can be improved. As a result, when bonding connection is performed, pad peeling of the bonding pad portion can be suppressed.

A method for manufacturing a semiconductor device, according to the present invention, comprises: a step of forming an insulating film on a wire; a step of forming a connecting hole in the insulating film at a position located on the wire; a step of forming a barrier metal layer in the connecting hole and on the insulating film; a step of forming a metal film on the barrier metal layer and in the connecting hole; a removing step of removing the metal layer and the barrier metal layer present on the insulating film so as to form a metal plug in the connecting hole; a step of forming a conductive film on the insulating film exposed by the removing step and the metal plug; a step of patterning the conductive film so as to form a bonding pad portion on the insulating film; a step of forming a passivation film on the bonding pad portion and the insulating film; and a step of forming a pad opening portion in the passivation film at a position located on the bonding pad portion.

A method for manufacturing a semiconductor device, according to the present invention, comprises: a step of forming an insulating film on a wire; a step of forming a connecting hole in the insulating film at a position located on the wire; a step of forming a barrier metal layer in the connecting hole and on the insulating film; a step of forming a sidewall on the inside surface of the opening portion with the barrier metal layer provided therebetween; a removing step of removing the barrier metal layer present on the insulating film; a step of forming a conductive film on the insulating film exposed by the removing step and in the connecting hole; a step of patterning the conductive film so as to form a bonding pad portion on the insulating film; a step of forming a passivation film on the bonding pad portion and the insulating film; and a step of forming a pad opening portion in the passivation film at a position located on the bonding pad portion.

A method for manufacturing a semiconductor device, according to the present invention, comprises: a step of forming an insulating film on a wire; a step of forming a connecting hole in the insulating film at a position located on the wire; a step of forming a barrier metal layer in the connecting hole and on the insulating film; a step of forming a metal film on the barrier metal layer and in the connecting hole; a removing step of removing the metal layer and the barrier metal layer present on the insulating film so as to form a metal plug in the connecting hole; a step of forming a conductive film on the insulating film exposed by the removing step and the metal plug; a step of patterning the conductive film so as to form a bonding pad portion on the insulating film; a step of forming a passivation film on the bonding pad portion and the insulating film; and a step of forming a pad opening portion in the passivation film at a position which is located on the bonding pad portion and which is not located over the metal plug.

In the method for manufacturing a semiconductor device according to the present invention, described above, it is preferable that the bottom layer forming the conductive film be not made of a Ti film.

DETAILED DESCRIPTION

Hereinafter, embodiments of the present invention will be described with reference to drawings.

Figure 1:
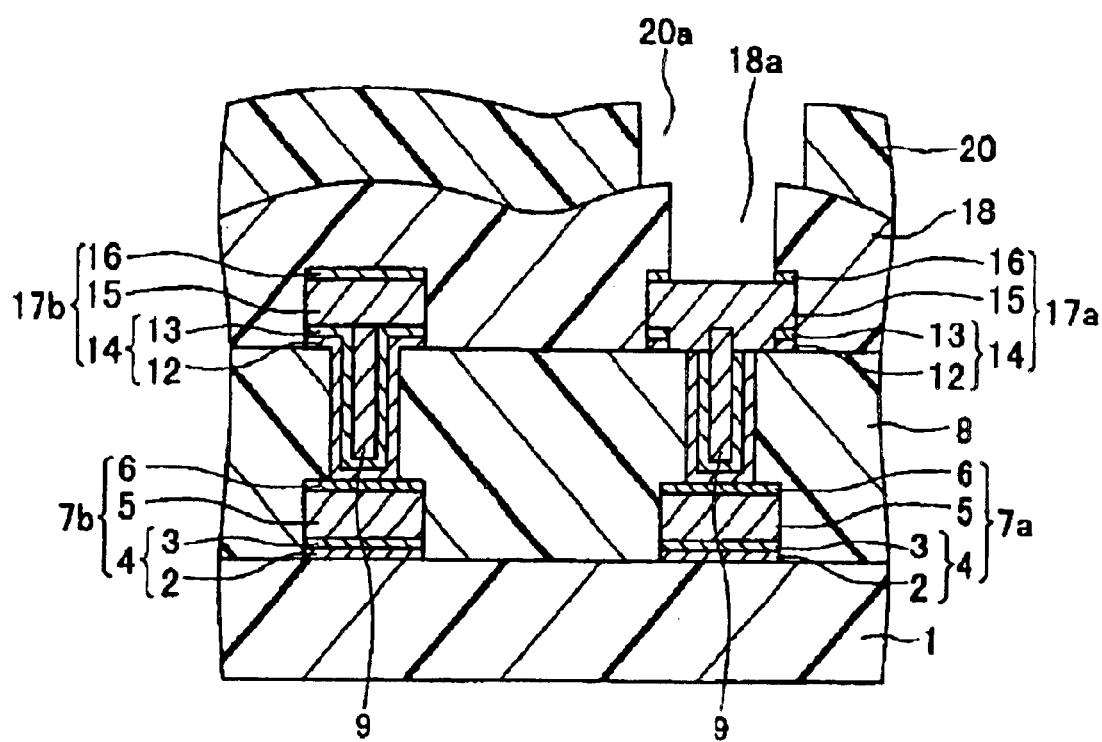
FIG. 1 is a cross-sectional view showing a semiconductor device according to a first embodiment of the present invention.

FIG. 1 is a cross-sectional view showing a semiconductor device of a first embodiment according to the present invention. This semiconductor device has bonding pad portions.

On an insulating film 1, first Al alloy wires 7a are 7b are formed. The first Al alloy wires 7a and 7b are each formed of a barrier metal layer 4, a first Al alloy film 5, and a antireflection film 6 provided in that order from the bottom. The barrier metal layer 4 is formed of a Ti film 2 and a TiN film 3 provided thereon.

On the first Al alloy wires 7a and 7b and the insulating film 1, an interlayer insulating film 8 containing Si is formed. In this interlayer insulating film 8, via holes (connecting holes) are formed at positions located on the first Al alloy wires 7a and 7b. Inside the connecting hole and on the interlayer insulating film 8, barrier metal layers 14 are formed. The barrier metal layer 14 is composed of a Ti film 12 and a TiN film 13 provided thereon.

On the barrier metal layer 14 provided in each connecting hole, a W plug 9 is formed. On the W plugs 9, a bonding pad portion 17a and a second Al alloy wire 17b are formed. The bonding pad portion 17a and the second Al alloy wire 17b are each composed of the barrier metal layer 14, a second Al alloy film (or a conductive film) 15, and a antireflection film 16 provided in that order from the bottom. A part of the antireflection film 16 of the bonding pad portion, which is located under a pad opening portion, is removed. In addition, a part of the barrier metal layer 14 located under the pad opening portion is removed. In this case, it is not necessary to remove the entire barrier metal layer 14 located under the pad opening portion but is desirable to remove at least a part of the barrier metal layer 14 thereunder. In addition, the barrier metal layer 14 on the interlayer insulating film 8 may be entirely removed.

On the bonding pad portion 17a, the second Al alloy wire 17b, and the interlayer insulating film 8, a passivation film 18 is formed, and an opening portion 18a is formed in this passivation film 18 at a position located on the bonding pad portion 17a. On the passivation film 18, a polyimide film 20 is formed, and in this polyimide film 20, an opening portion 20a is formed. By this opening portion 20a and the opening portion 18a, a pad opening portion is formed. A wire is to be connected by bonding connection to the bonding pad portion 17a exposed through this pad opening portion.

FIGS. 2(A) to (C), and FIGS. 3(D) and (E) are cross-sectional views showing a method for manufacturing the semiconductor device shown in FIG. 1.

Figure 2A:
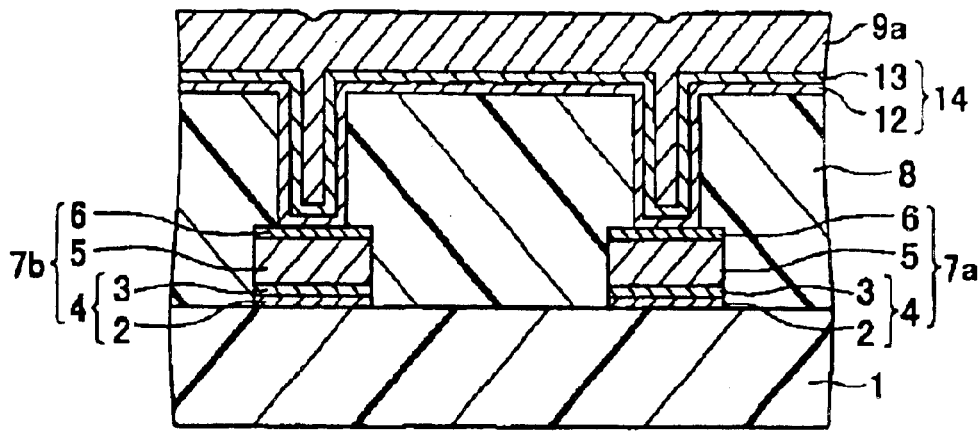
FIGS. 2A–C include cross-sectional views each showing a manufacturing method of the semiconductor device shown in FIG. 1.

First, as shown in FIG. 2(A), after the solid Ti film 2 is deposited on the insulating film 1 by sputtering, the solid TiN film 3 is deposited on this solid Ti film 2 by sputtering. As described above, the solid barrier metal layer 4 composed of the solid Ti film 2 and the solid TiN film 3 is formed on the insulating film 1.

Next, on this solid barrier metal layer 4, the solid first Al alloy film 5 is formed by sputtering, and on this solid first Al alloy film 5, the solid antireflection film 6 made of a TiN film is formed. Subsequently, the solid antireflection film 6, the solid first Al alloy film 5, and the solid barrier metal layer 4 are patterned. Accordingly, on the insulating film 1, the first Al alloy wires 7a and 7b are formed.

Next, over the first Al alloy wires 7a and 7b, the interlayer insulating film 8 primarily composed of an oxide film is formed. This interlayer insulating film 8 is then processed by etching, thereby forming the via holes (connecting holes) therein at positions located on the first Al alloy wires 7a and 7b. Subsequently, inside the via holes and on the interlayer insulating film 8, the solid Ti film 12 is deposited by sputtering, and on this solid Ti film 12, the solid TiN film 13 is then deposited by sputtering. As described above, inside the via holes and on the interlayer insulating film 8, the solid barrier metal layer 14 composed of the solid Ti film 12 and the solid TiN film 13 is formed. Next, on the solid barrier metal layer 14 and inside the via holes, a W film 9a is deposited by a CVD method.

Figure 2B:
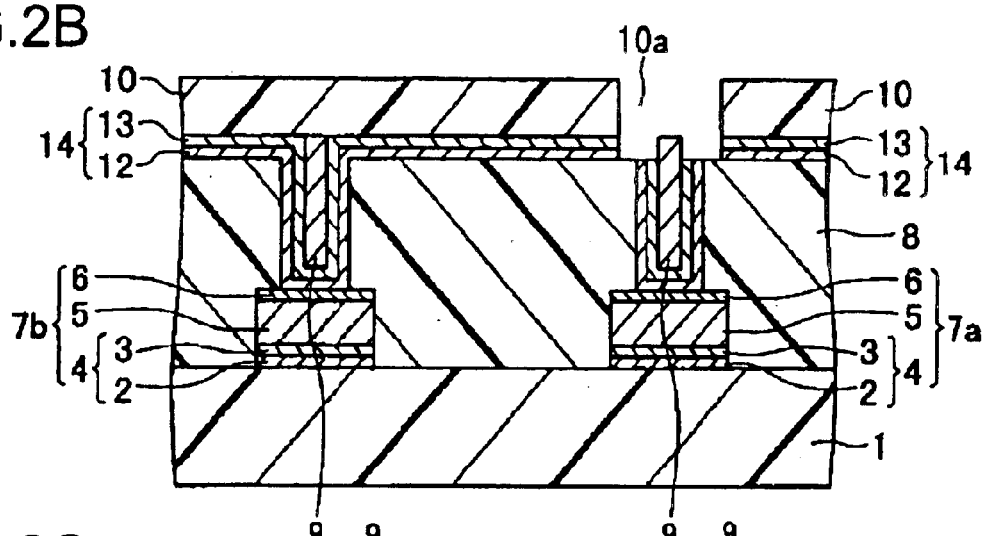

Subsequently, as shown in FIG. 2(B), the W film 9a present on the interlayer insulating film 8 is removed by etching (etch back), and hence the W plugs 9 are buried in the via holes formed in the interlayer insulating film 8. Next, a photoresist film is formed over the entire surface including the solid barrier metal layer 14 by coating, followed by exposure and development, and as a result, a resist pattern 10 having a pad opening portion 10a is formed on the solid barrier metal layer 14. The solid barrier metal layer 14 is etched using this resist pattern 10 as a mask, thereby removing the solid barrier metal layer located under the pad opening portion 10a.

Figure 2C:
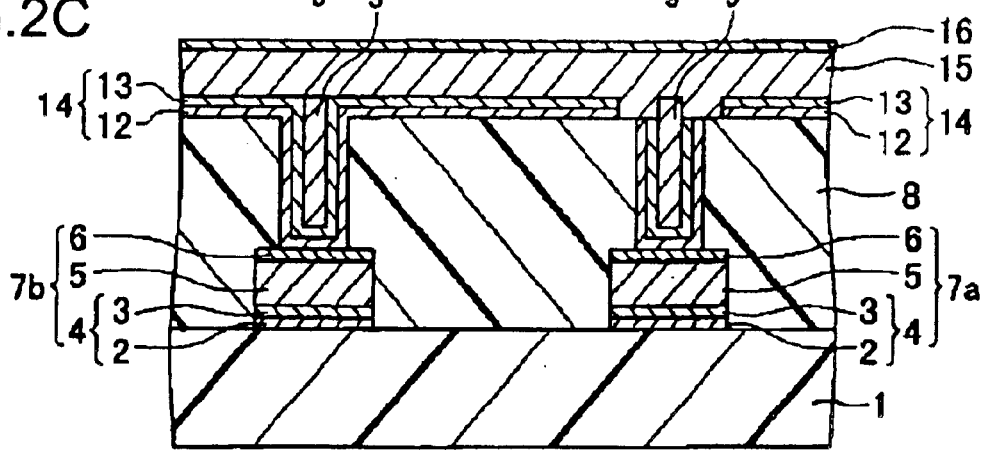

Next, as shown in FIG. 2(C), after the resist pattern 10 is removed, over the entire surface including the W plugs 9, the solid second Al alloy film 15 is deposited by sputtering, and on the solid second Al alloy film 15, the solid antireflection film 16 made of a TiN film is formed by sputtering.

Figure 3D:
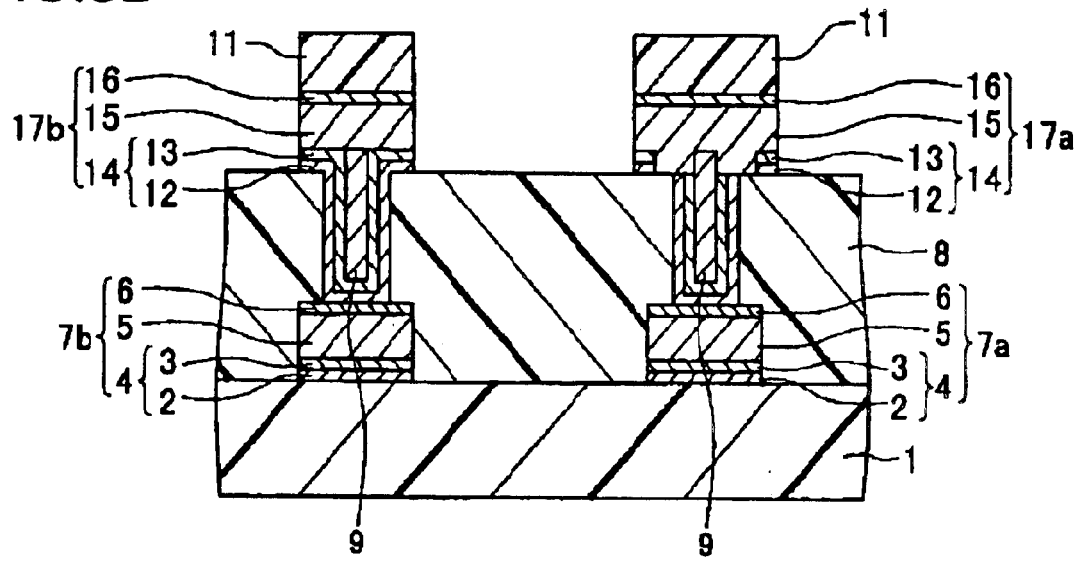
FIGS. 3D and E include cross-sectional views each showing a manufacturing method of the semiconductor device shown in FIG. 1.

Next, as shown in FIG. 3(D), onto the solid antireflection film 16, a photoresist film is applied, followed by exposure and development thereof, and hence a resist pattern 11 is formed on the solid antireflection film 16. The solid antireflection film 16, the solid second Al alloy film 15, and the solid barrier metal layer 14 are then etched using this resist pattern 11 as a mask. Accordingly, the bonding pad portion 17a and the second Al alloy wire 17b are formed on the interlayer insulating film 8. The bonding pad portion 17a is electrically connected to the first Al alloy wire 7a via the W plug 9, and the second Al alloy wire 17b is electrically connected to the first Al alloy wire 7b via the W plug 9.

Figure 3E:
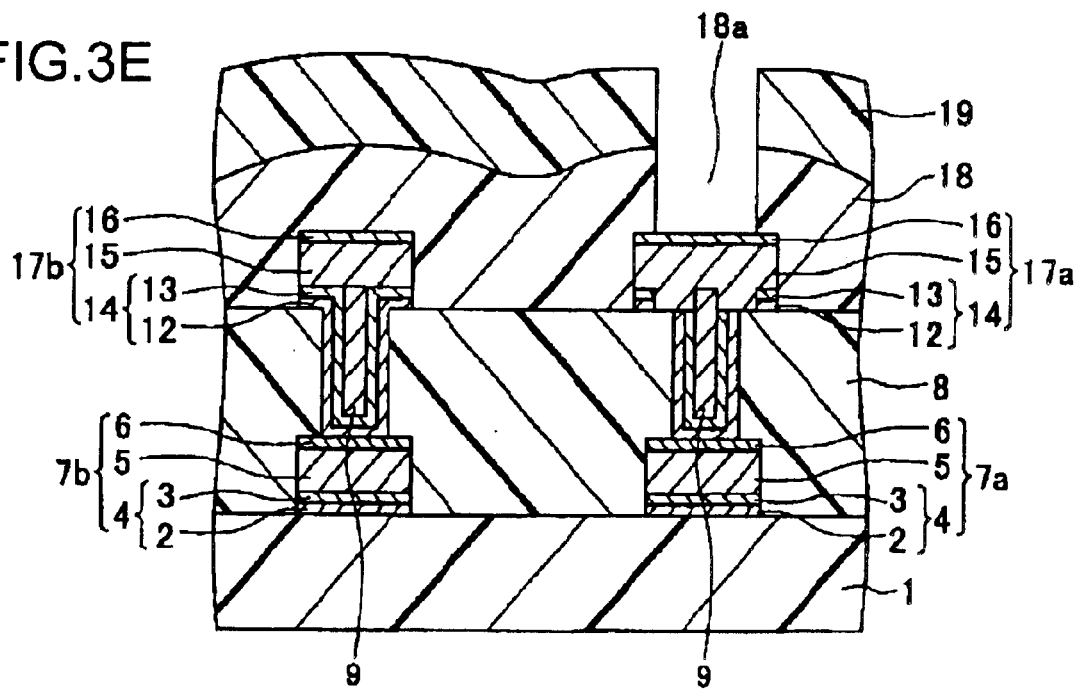

Next, as shown in FIG. 3(E), after the resist pattern 11 is removed, the passivation film 18 made of a silicon nitride film or the like is deposited by a CVD method over the entire surface including the bonding pad portion 17a and the second Al alloy wire 17b. Next, onto the passivation film 18, a photoresist film is provided by coating, followed by exposure and development thereof, thereby forming a resist pattern 19 on the passivation film 18. Next, by using this resist pattern 19 as a mask, the passivation film 18 is etched, and hence the opening portion 18a is formed in the passivation film 18 described above at a position located on the bonding pad portion 17a.

Subsequently, as shown in FIG. 1, on the passivation film 18, the polyimide film 20 is formed, and by processing this polyimide film 20, the opening portion 20a is formed at a position located on the opening portion 18a. Next, the antireflection film 16 exposed through the opening portion 18a is removed by etching. As a result, the pad opening portion for bonding is formed for the bonding pad portion 17a, and through this pad opening portion, the surface of the bonding pad portion 17a is exposed. Next, to this exposed bonding pad portion 17a, a wire is to be connected by bonding connection.

According to the first embodiment described above, the barrier metal layer 14, which is a part of the bonding pad portion 17a and which is located on the interlayer insulating film 8, is removed. Accordingly, in the area at which the barrier metal layer 14 is removed, the formation of a vulnerable alloy layer having poor stress resistance can be prevented at the interface between the Ti film 12 of the barrier metal layer 14 and the interlayer insulating film 8. Hence, in connecting a wire to the bonding pad portion 17a, even when a stress is applied to the bonding pad portion 17a in bonding connection, peeling of the bonding pad portion 17a caused by this stress can be suppressed.

Figure 4:
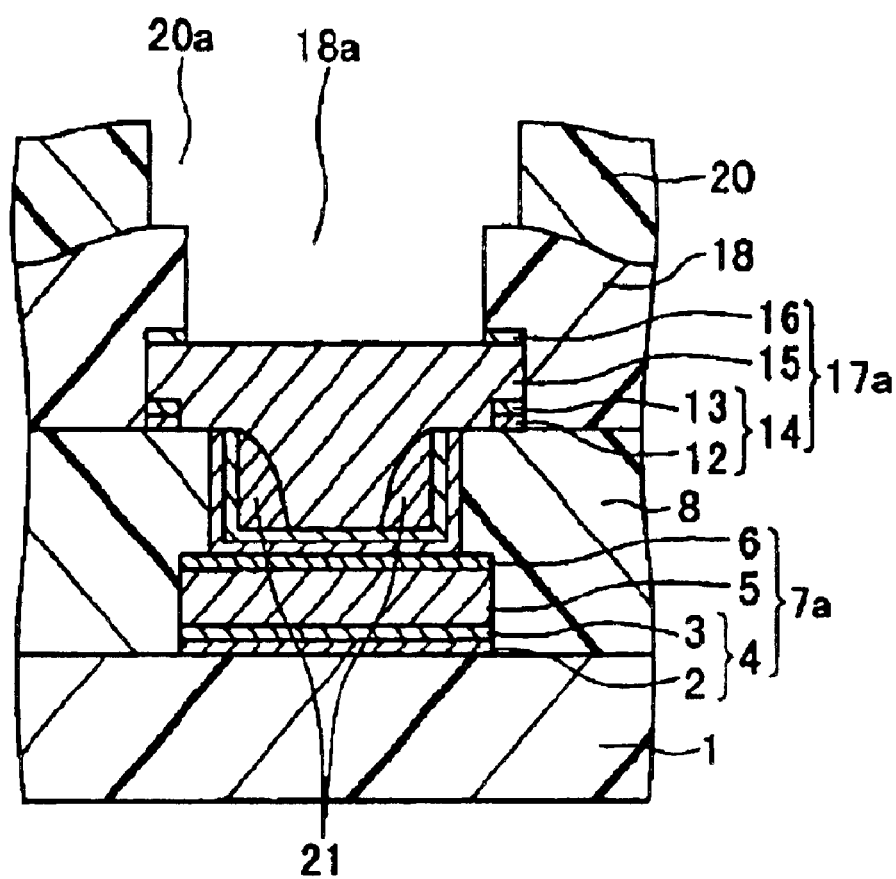
FIG. 4 is a cross-sectional view showing a semiconductor device according to a second embodiment of the present invention.

FIG. 4 is a cross-sectional view of a semiconductor device according to a second embodiment of the present invention, the same reference numerals of the constituent elements described above designate the same constituent elements in this embodiment, and different constituent elements will only be described.

On the inside surface of the via hole (connecting hole) formed in the interlayer insulating film 8, a sidewall 21 made of a W film is formed with the barrier metal layer 14 provided therebetween.

The second Al alloy film (or a conductive film) 15 is formed on the side wall 21, inside the connecting hole, and on the barrier metal layer 14, and on the second Al alloy film 15, the antireflection film 16 is formed. The antireflection film 16, the second Al alloy film 15, and the barrier metal layer 14 form the bonding pad portion 17a.

That is, the bonding pad portion 17a is electrically connected to the first Al alloy wire 7a via the side wall 21 and the second Al alloy film 15 provided in the via hole.

A part of the antireflection film 16 of the bonding pad portion located under the pad opening portion is removed. In addition, a part of the barrier metal layer 14 located under the pad opening portion is also removed. In this embodiment, it is not necessary to be removed the entire barrier metal layer located under the pad opening portion but is desirable necessary to remove at least a part of the barrier metal layer thereunder.

The passivation film 18 is formed over the bonding pad portion 17a and the interlayer insulating film 8, and the opening portion 18a is formed in this passivation film 18 at a position located on the bonding pad portion. On the passivation film 18, the polyimide film 20 is formed, and the opening portion 20a is formed therein.

FIGS. 5(A) to (C) and FIGS. 6(D) and (E) are cross-sectional views each showing a method for manufacturing the semiconductor device shown in FIG. 4, the same reference numerals of the constituent elements in FIGS. 2 and 3 designate the same constituent elements in these figures, and different constituent elements will only be described.

Figure 5A:
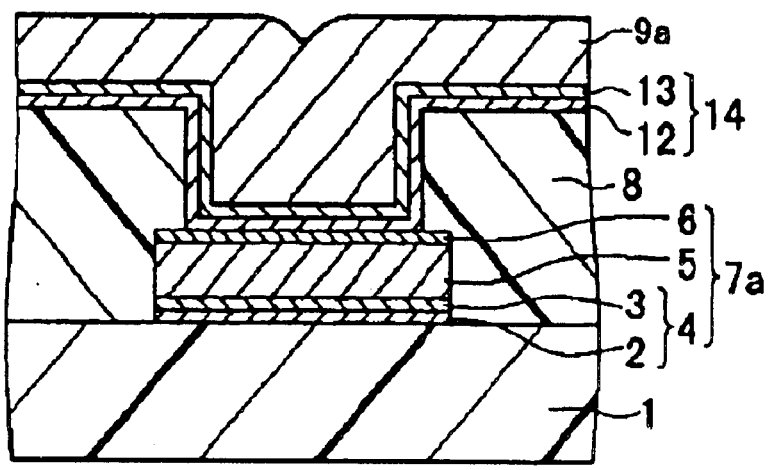
FIGS. 5A–C include cross-sectional views each showing a manufacturing method of the semiconductor device shown in FIG. 4.

As shown in FIG. 5(A), on the solid barrier metal layer 14 and inside the via hole (connecting hole), the W film 9a is deposited by a CVD method.

Figure 5B:
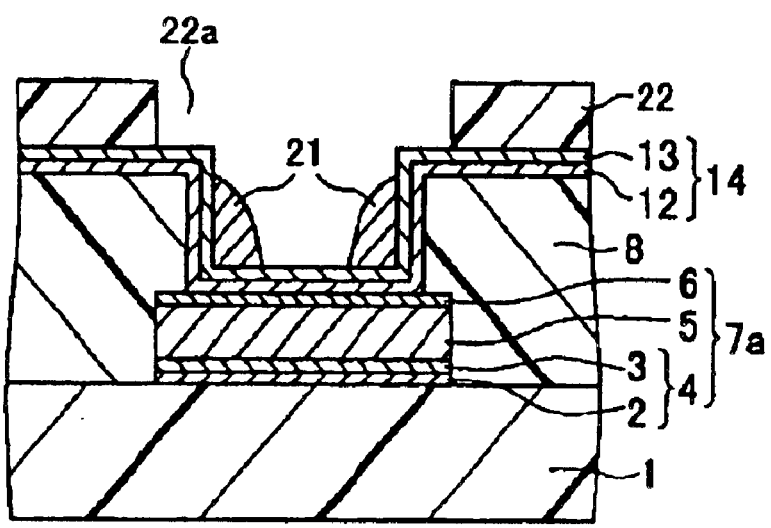

Next, as shown in FIG. 5(B), the W film 9a is etched-back, thereby forming the sidewall 21 made of a W film on the inside surface of the via hole. Subsequently, a photoresist film is provided on the solid barrier metal layer 14 by coating and is then exposed and developed, thereby forming a resist pattern 22 having an opening portion 22a on the solid barrier metal layer 14.

Figure 5C:
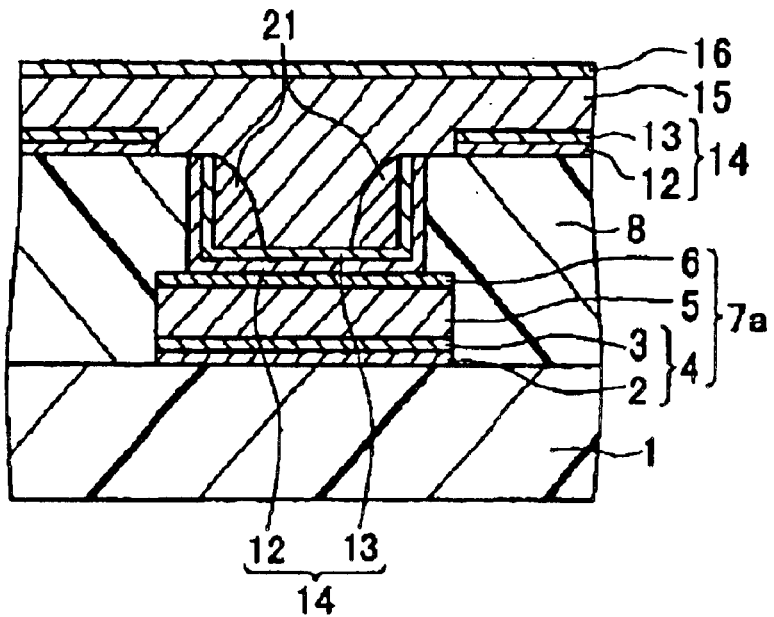

The solid barrier metal layer 14 is then etched by using this resist pattern 22 as a mask, and hence as shown in FIG. 5(C), a part of the solid barrier metal layer located under the opening potion 22a is removed. Over the entire surface including the sidewall 21 and the inside of the via hole, the solid second Al alloy film 15 is deposited by sputtering, and the solid antireflection film 16 made of a TiN film is formed thereon by sputtering. The solid second Al alloy film 15 is likely to be buried in the via hole due to the presence of the sidewall 21.

Figure 6D:
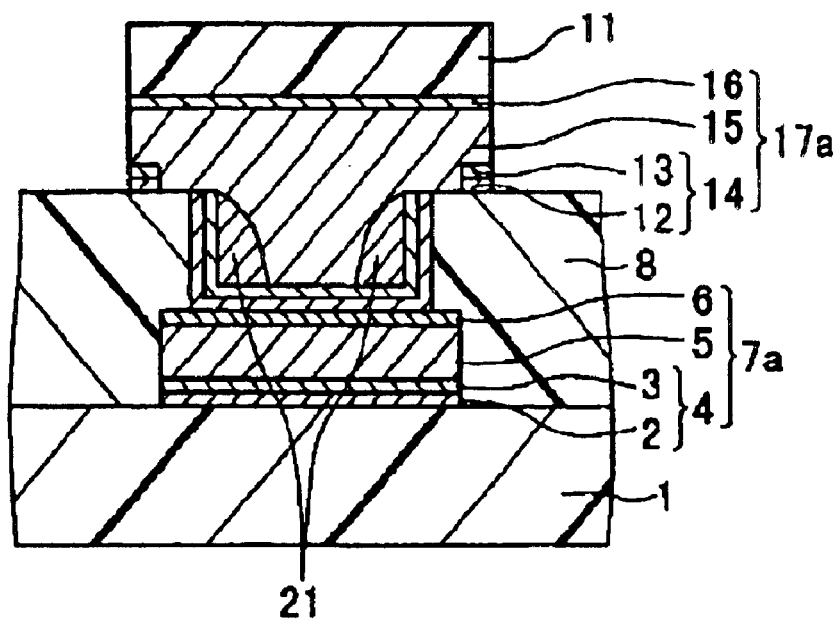
FIGS. 6D and E include cross-sectional views each showing a manufacturing method of the semiconductor device shown in FIG. 4.

Subsequently, as shown in FIG. 6(D), the resist pattern 11 is formed on the solid antireflection film 16, and the solid antireflection film 16, the solid second Al alloy film 15, and the solid barrier metal layer 14 are patterned using the resist pattern 11 as a mask. Hence, on the interlayer insulating film 8, the bonding pad portion 17a is formed. The bonding pad portion 17a is electrically connected to the first Al alloy wire 7a via the sidewall 21 which is buried in the via hole and the second Al alloy film.

Figure 6E:
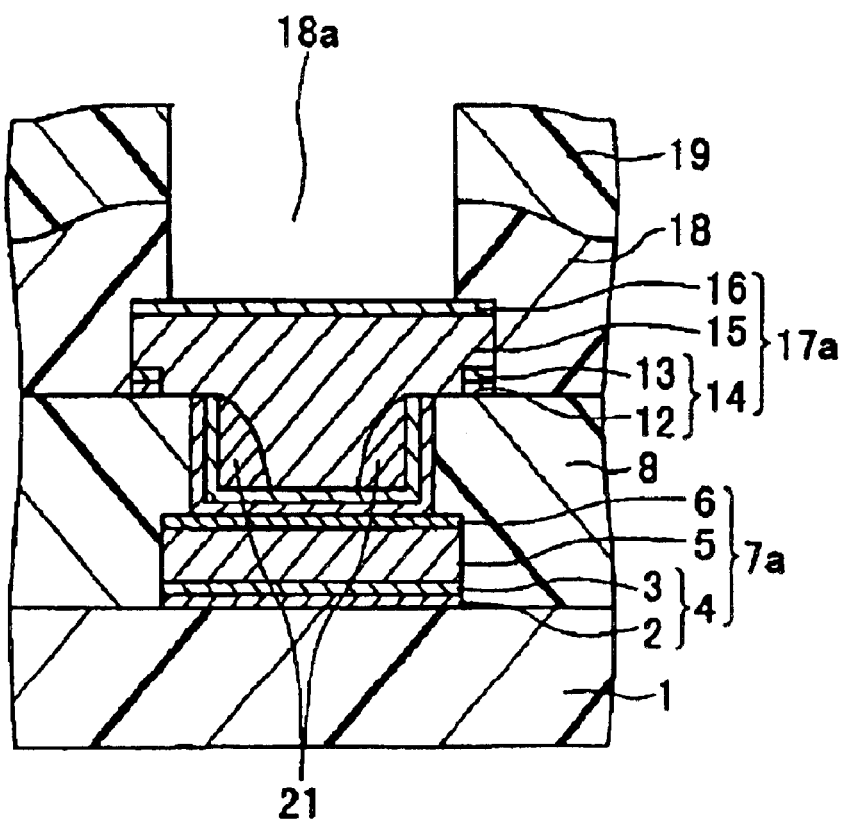

Next, as shown in FIG. 6(E), after the resist pattern 11 is removed, over the entire surface including the bonding pad portion 17a and the second Al alloy wire 17b, the passivation film 18 made of silicon nitride or the like is deposited by a CVD method, and on this passivation film 18, the resist pattern 19 is formed. Subsequently, the passivation film 18 is etched using this resist pattern 19 as a mask, and hence the opening portion 18a is formed in the passivation film 18 at a position located on the bonding pad portion 17a. Next, as shown in FIG. 4, the polyimide film 20 is formed on the passivation film 18, and the opening portion 20a is formed in this polyimide film 20.

In the second embodiment described above, the same effect as that in the first embodiment can be obtained.

In addition, in this embodiment, since the sidewall 21 of a W film is formed on the inside surface of the via hole, when the solid second Al alloy film 15 is provided in the via hole, the fluidity thereof is improved by the presence of this sidewall 21, and hence the solid second Al alloy film can be buried in the via hole without generating voids. Accordingly, the increase in connection resistance and the generation of connection failures caused by voids or the like formed inside the via hole can be suppressed.

Figure 7:
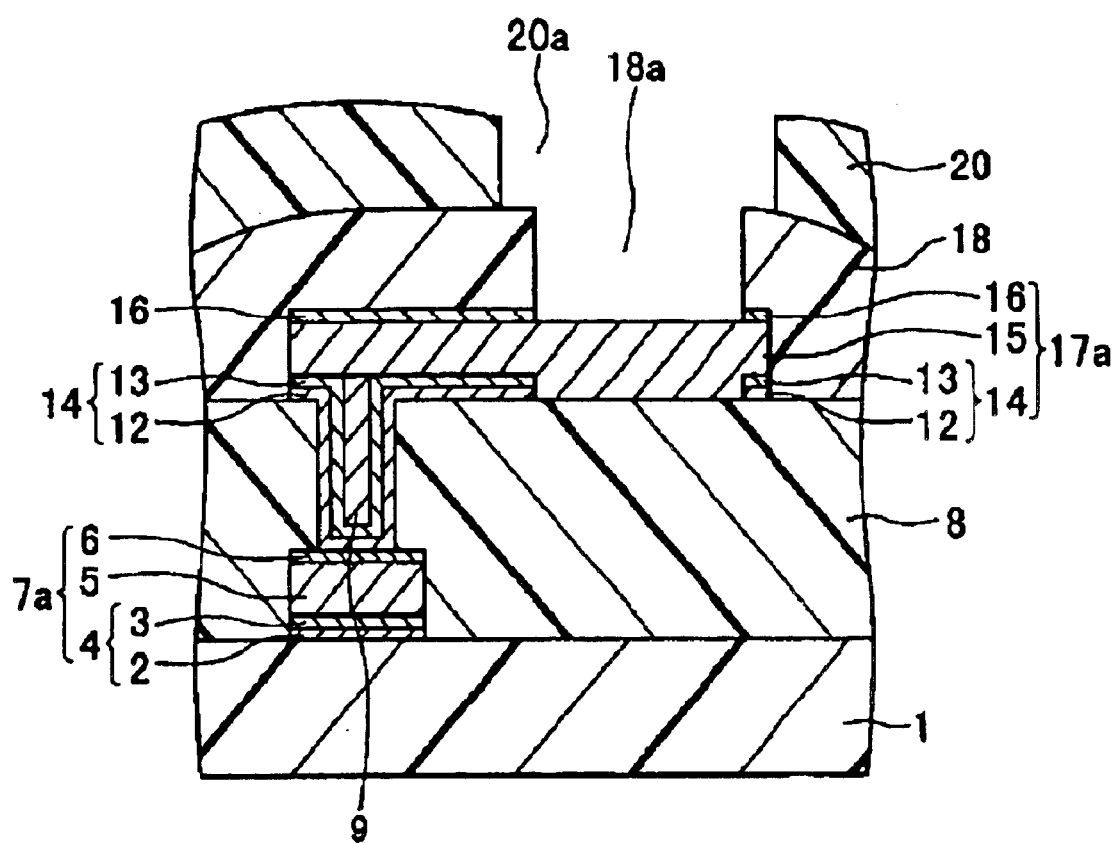
FIG. 7 is a cross-sectional view showing a semiconductor device according to a third embodiment of the present invention.

FIG. 7 is a cross-sectional view of a semiconductor device according to a third embodiment of the present invention. The same reference numerals of the constituent elements described above designate the same constituent elements in this embodiment, and different constituent elements will only be described.

On the W plug 9, the bonding pad portion 17a is formed. On the bonding pad portion 17a and the interlayer insulating film 8, the passivation film 18 is formed, and the opening portion 18a is formed in this passivation film 18 at a position located on the bonding pad portion 17a. The polyimide film 20 is formed on the passivation film 18, and the opening portion 20a is formed in this polyimide film 20. This opening portion 20a and the opening portion 18a described above form the pad opening portion. This pad opening portion is not located over the W plug 9 and is located at a position on the bonding pad portion 17a, which position is adjacent to the W plug 9 or in the vicinity thereof.

Figure 8A:
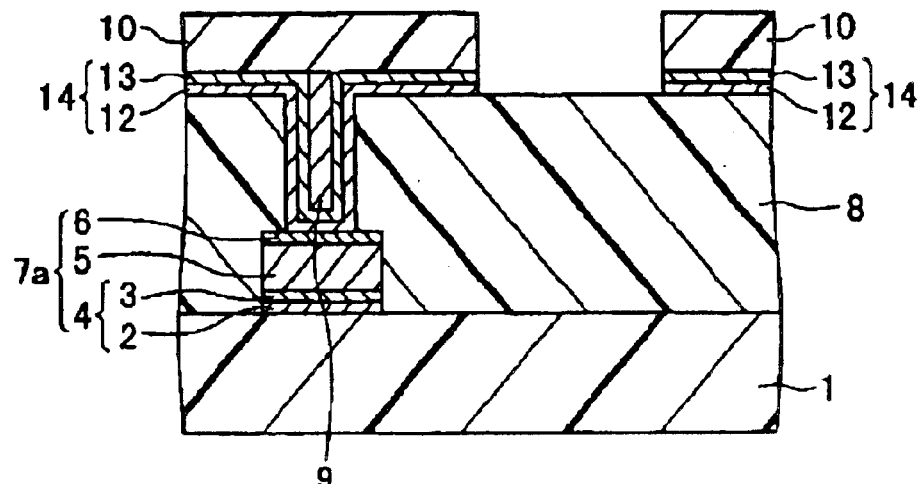
FIGS. 8A–C include cross-sectional views each showing a manufacturing method of the semiconductor device shown in FIG. 7.
Figure 8B:
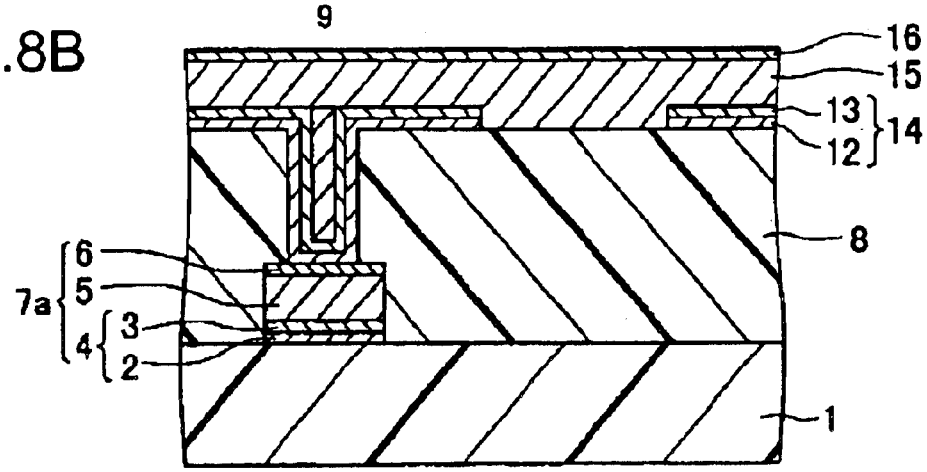
Figure 8C:
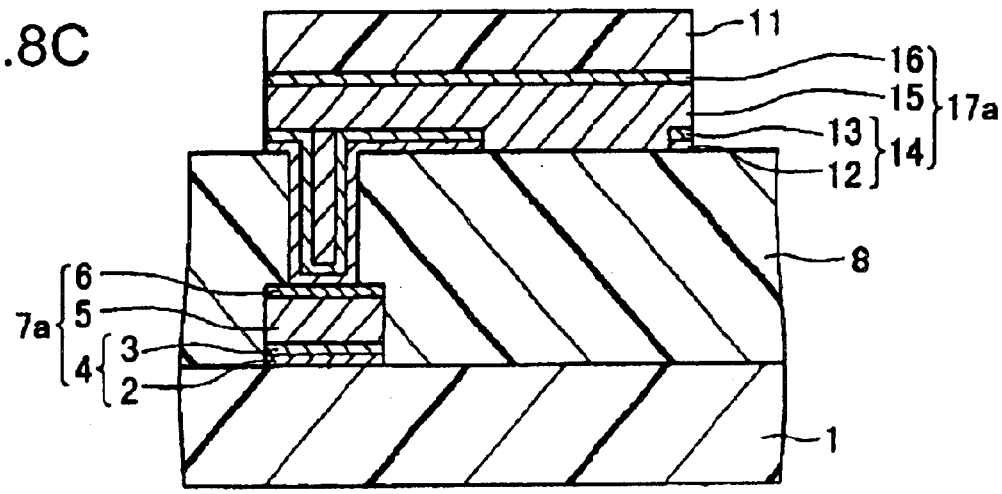

FIGS. 8(A) to (C) are cross-sectional views showing a method for manufacturing the semiconductor device shown in FIG. 7, the same reference numerals of the constituent elements shown in FIGS. 2 and 3 designate the same constituent elements in this embodiment, and different constituent elements will only be described.

As shown in FIG. 8(A), the first Al alloy wire 7a is formed on the insulating film 1, and the interlayer insulating film 8 is formed over the first Al alloy wire 7a and the insulating film 1. Next, in this interlayer insulating film 8, the via hole (connecting hole) is formed, and inside this via hole and on the interlayer insulating film 8, the solid barrier metal layer 14 is formed. Subsequently, the W plug 9 is buried in the via hole formed in the interlayer insulating film 8.

On this solid barrier metal layer 14, the resist pattern 10 having the pad opening portion 10a therein is then formed, and the solid barrier metal layer 14 is etched using this resist pattern 10 as a mask, thereby removing a part of the solid barrier metal layer 14 located under the pad opening potion 10a. As shown in FIG. 8(A), the pad opening portion 10a is not located over the W plug 9 and is located in the vicinity of the W plug 9 and at a distance therefrom.

Next, as shown in FIG. 8(B), after the resist pattern 10 is removed, over the entire surface including the W plug 9, the solid second Al alloy film 15 is deposited as a conductive film, and on the solid second Al alloy film 15, the solid antireflection film 16 is formed.

Subsequently, as shown in FIG. 8(C), on the solid antireflection film 16, the resist pattern 11 is formed, and the solid antireflection film 16, the solid second Al alloy film 15, and the solid barrier metal layer 14 are etched using this resist pattern 11 as a mask. Accordingly, on the interlayer insulating film 8, the bonding pad portion 17a is formed. The bonding pad portion 17a is electrically connected to the first Al alloy wire 7a via the W plug 9.

Next, as shown in FIG. 7, after the resist pattern 11 is removed, over the entire surface including the bonding pad portion 17a, the passivation film 18 made of a silicon nitride film or the like is deposited, and in this passivation film 18, the opening portion 18a is formed at a position located on the bonding pad portion 17a. Subsequently, on this passivation film 18, the polyimide film 20 is formed, and the opening portion 20a is formed in the polyimide film 20 at a position located on the opening portion 18a. As described above, the pad opening portion for bonding is formed for the bonding pad portion 17a, and the surface thereof is exposed through this pad opening portion. The pad opening portion described above is not located over the W plug 9 and is located at a position on the bonding pad portion 17a, which position is adjacent to the W plug 9 or in the vicinity thereof.

In the third embodiment described above, the same effect as that in the first embodiment can be obtained.

In addition, in this embodiment, since the pad opening portion is not formed over the W plug 9 and is disposed at a position on the bonding pad portion 17a, which position is adjacent to the W plug 9 or in the vicinity thereof, the area of the top surface or the bottom surface of the bonding pad portion 17a can be increased as compared to that in the first embodiment. Accordingly, the adhesion between the bonding pad portion 17a and the interlayer insulating film 8 can be improved. As a result, when the bonding connection is performed, pad peeling of the bonding pad portion can be suppressed.

Figure 9:
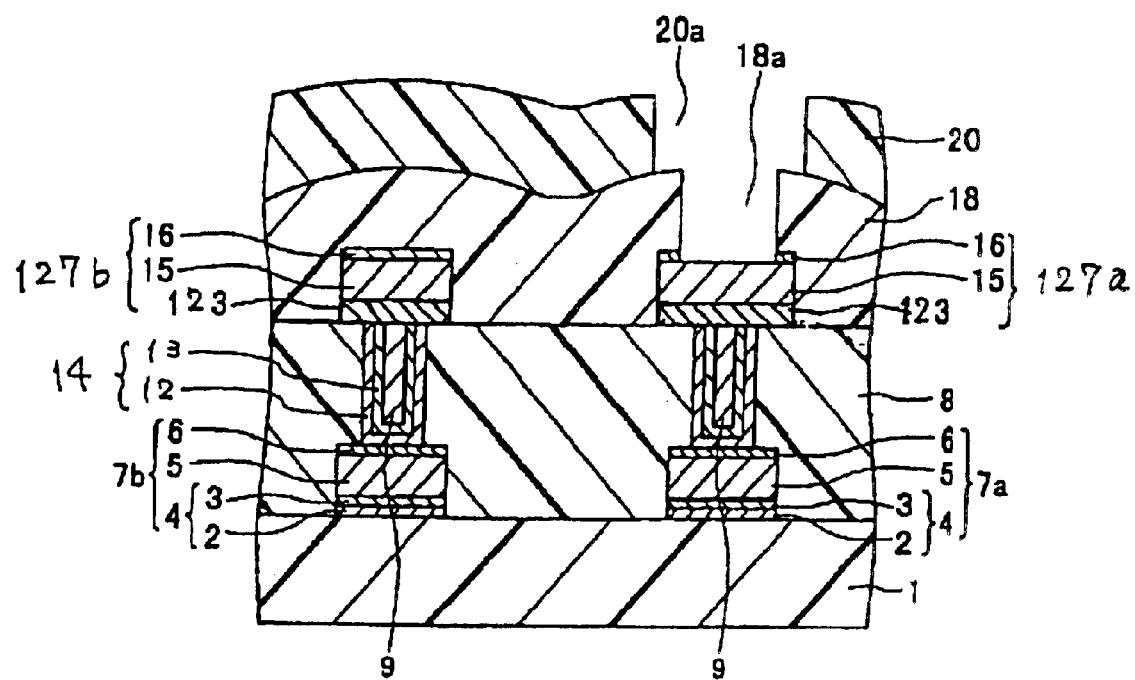
FIG. 9 is a cross-sectional view showing a semiconductor device according to a fourth embodiment of the present invention.

FIG. 9 is a cross-sectional view showing a semiconductor device according to a fourth embodiment of the present invention, the same reference numerals of the constituent elements shown in FIG. 1 designate the same constituent elements in this embodiment, and different constituent elements will only be described.

The solid barrier metal layer 14 on the interlayer insulating film 8 is entirely removed, a second Al alloy wire 127b and a bonding pad portion 127a, each composed of a TiN film 123, the second Al alloy wire 15, and the antireflection film 16, are formed. That is, the Al alloy wire 127b and the bonding pad portion 127a are each formed so that the TiN film 123 is in contact with the interlayer insulating film 8.

FIGS. 10(A) to (C) and FIGS. 11(D) and (E) are cross-sectional views showing a manufacturing method of the semiconductor device shown in FIG. 9, the same reference numerals of the constituent elements shown in FIGS. 2 and 3 designate the same constituent elements in this embodiment, and different constituent elements will only be described.

Figure 10A:
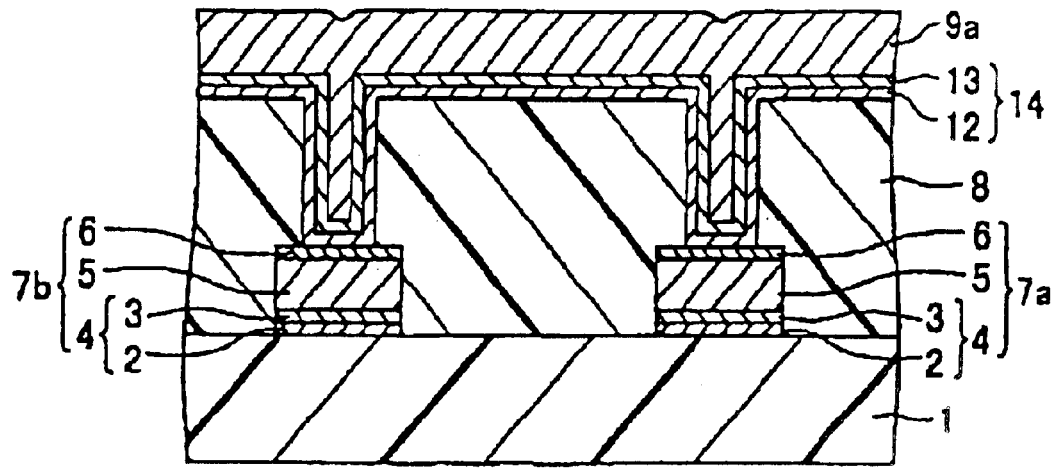
FIGS. 10A–C include cross-sectional views each showing a manufacturing method of the semiconductor device shown in FIG. 9.

As shown in FIG. 10(A), the W film 9a is deposited on the solid barrier metal layer 14 and inside the via holes (connecting hole) by a CVD method.

Figure 10B:
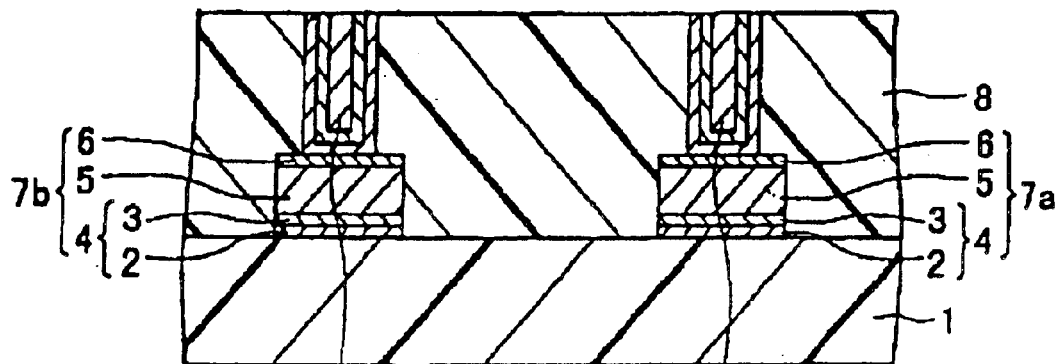
Figure 10C:
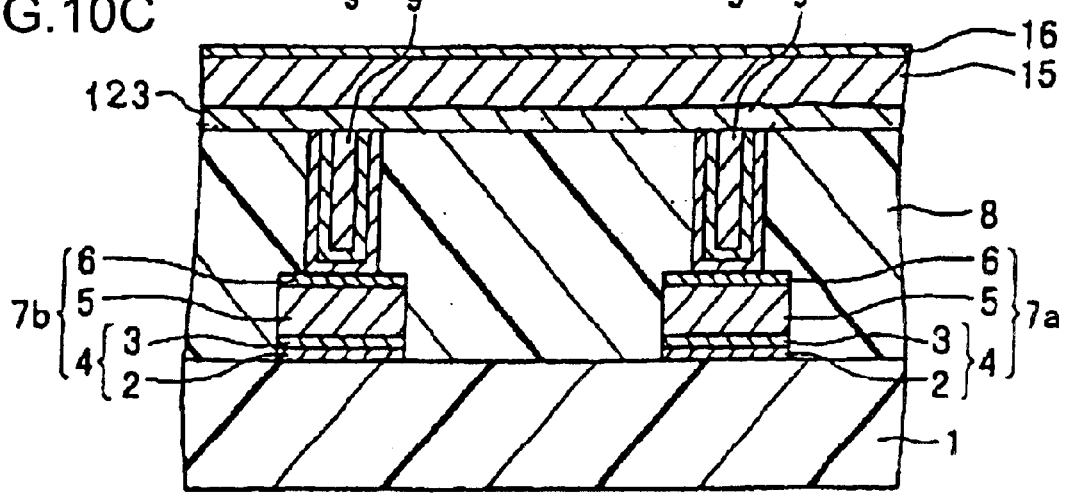

Next, as shown in FIG. 10(B), the W film 9a and the solid barrier metal layer 14 on the interlayer insulating film 8 are removed by CMP (chemical mechanical polishing). Subsequently, the solid TiN film 123 is deposited over the entire surface by sputtering, the solid second Al alloy film 15 is deposited on the solid TiN film 123 by sputtering, and the solid antireflection film 16 of a TiN film is formed on the solid second Al alloy film 15 by sputtering.

Figure 11D:
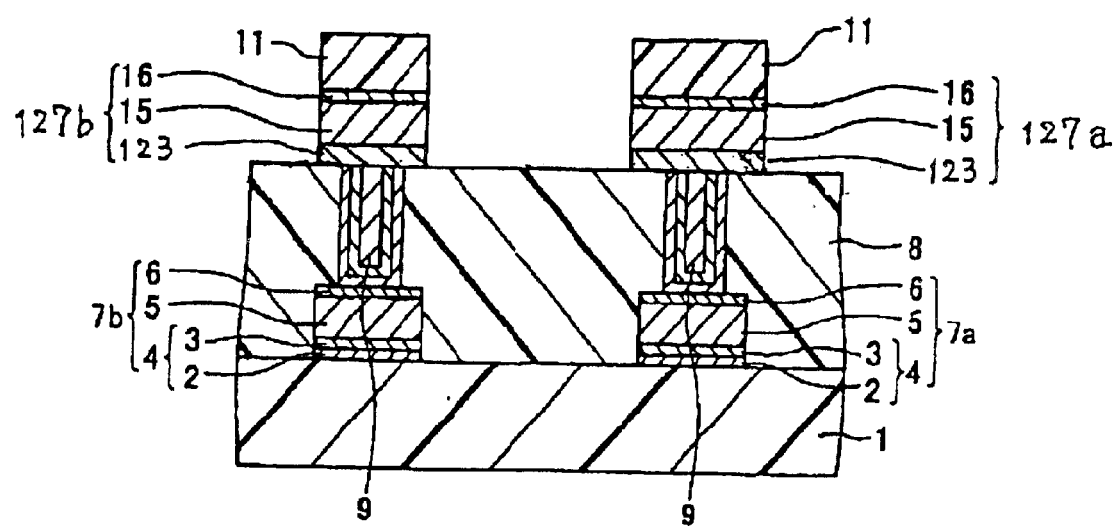
FIGS. 11D and E include cross-sectional views each showing a manufacturing method of the semiconductor device shown in FIG. 9.
Figure 11E:
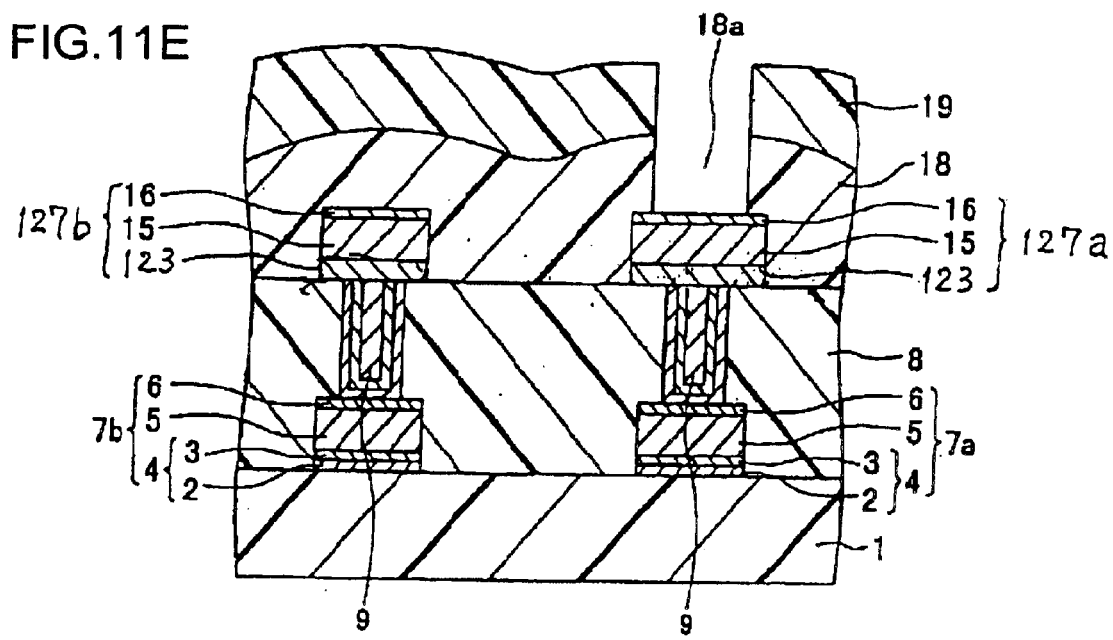

Subsequently, as shown in FIG. 11(D), the second Al wire layer 127b and the bonding pad portion 127a are formed by patterning.

In the fourth embodiment described above, the same effect as that in the first embodiment can be obtained. In addition, the TiN film 123 is not always necessary.

Figure 12:
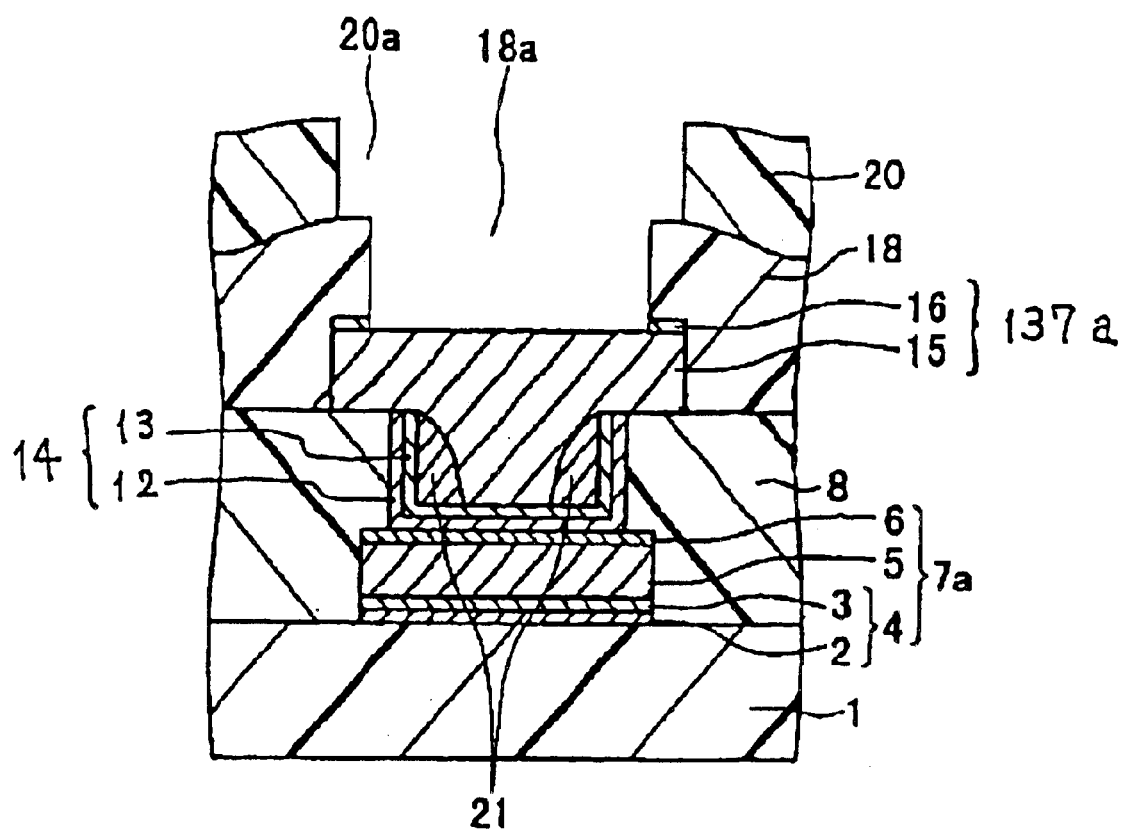
FIG. 12 is a cross-sectional view showing a semiconductor device according to a fifth embodiment of the present invention.

FIG. 12 is a cross-sectional view showing a semiconductor device according to a fifth embodiment of the present invention, the same reference numerals of the constituent elements shown in FIG. 2 designate the same constituents in this embodiment, and different constituent elements will only be described. The solid barrier metal layer 14 on the interlayer insulating film 8 is entirely removed, and a bonding pad portion 137a is formed from the second Al alloy film 15 and the antireflection film 16.

FIGS. 13(A) to (C) and FIGS. 14(D) and (E) are cross-sectional views showing a manufacturing method of the semiconductor device shown in FIG. 12, the same reference numerals of the constituent elements shown in FIGS. 5 and 6 designate the same constituent elements in this embodiment, and different constituent elements will only be described.

Figure 13A:
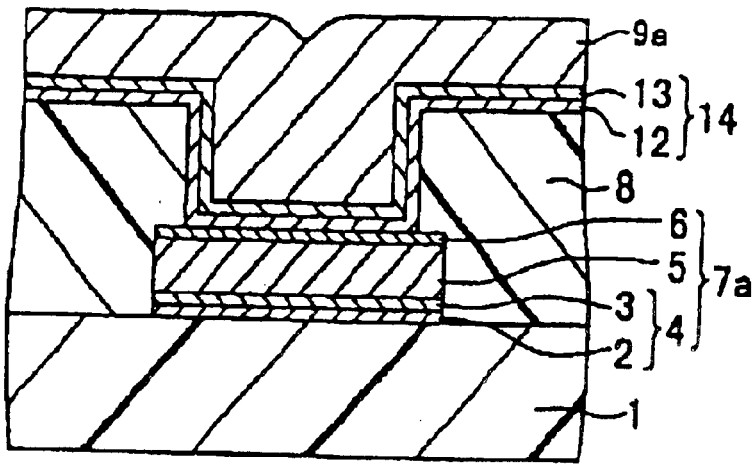
FIGS. 13A–C include cross-sectional views each showing a manufacturing method of the semiconductor device shown in FIG. 12.
Figure 13B:
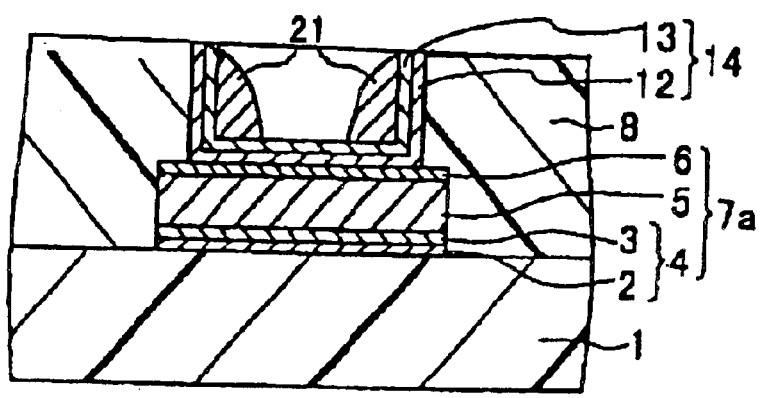
Figure 13C:
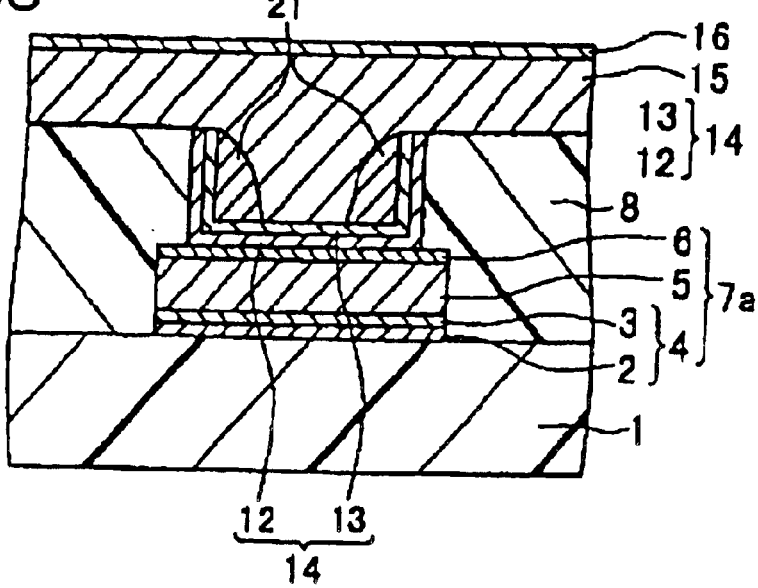
Figure 14D:
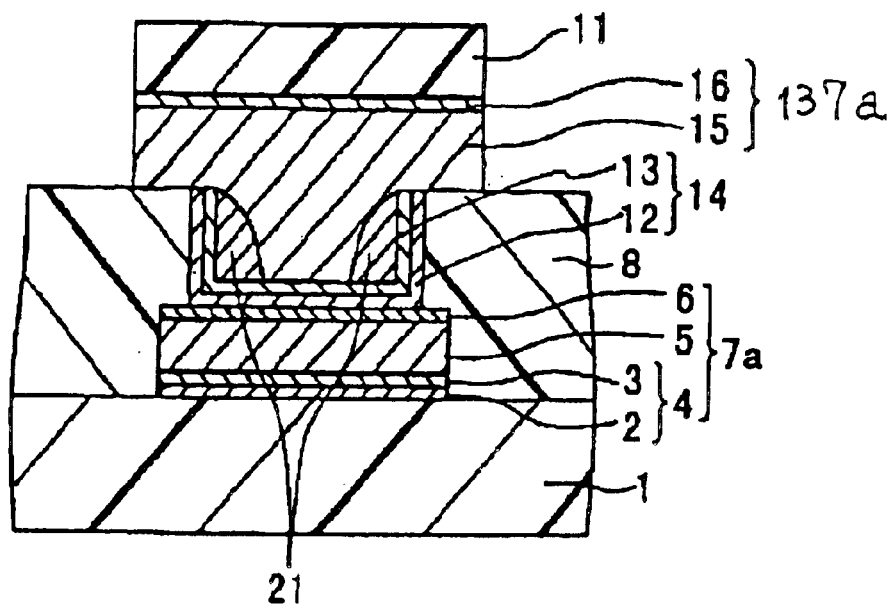
FIGS. 14D and E include cross-sectional views each showing a manufacturing method of the semiconductor device shown in FIG. 12.
Figure 14E:
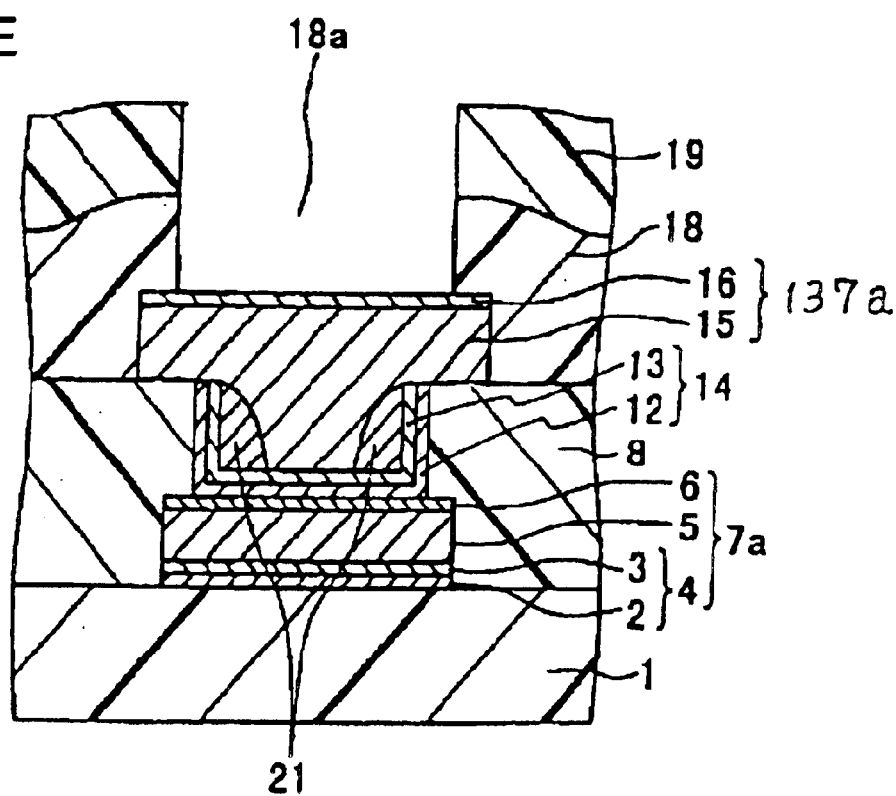

As shown in FIG. 13(A), the W film 9a is deposited on the solid barrier metal layer 14 and inside the via hole (connecting hole) by a CVD method. Next, as shown in FIG. 13(B), after the sidewall 21 of a W film is formed on the inside surface of the via hole, the solid barrier metal layer 14 on the interlayer insulating film 8 is removed by CMP. Subsequently, as shown in FIG. 13(C), the solid second Al wire layer 15 is deposited over the entire surface including the sidewall 21 and the inside of the via hole by sputtering, the solid antireflection film 16 of a TiN film is formed on the solid second Al wire film 15 by sputtering, and as shown in FIG. 14(D), the bonding pad portion 137a is formed by patterning.

In the fifth embodiment described above, the same effects as those in the first and the second embodiments can be obtained. In addition, a TiN film may be used under the Al alloy film 15 of the bonding pad portion.

Figure 15:
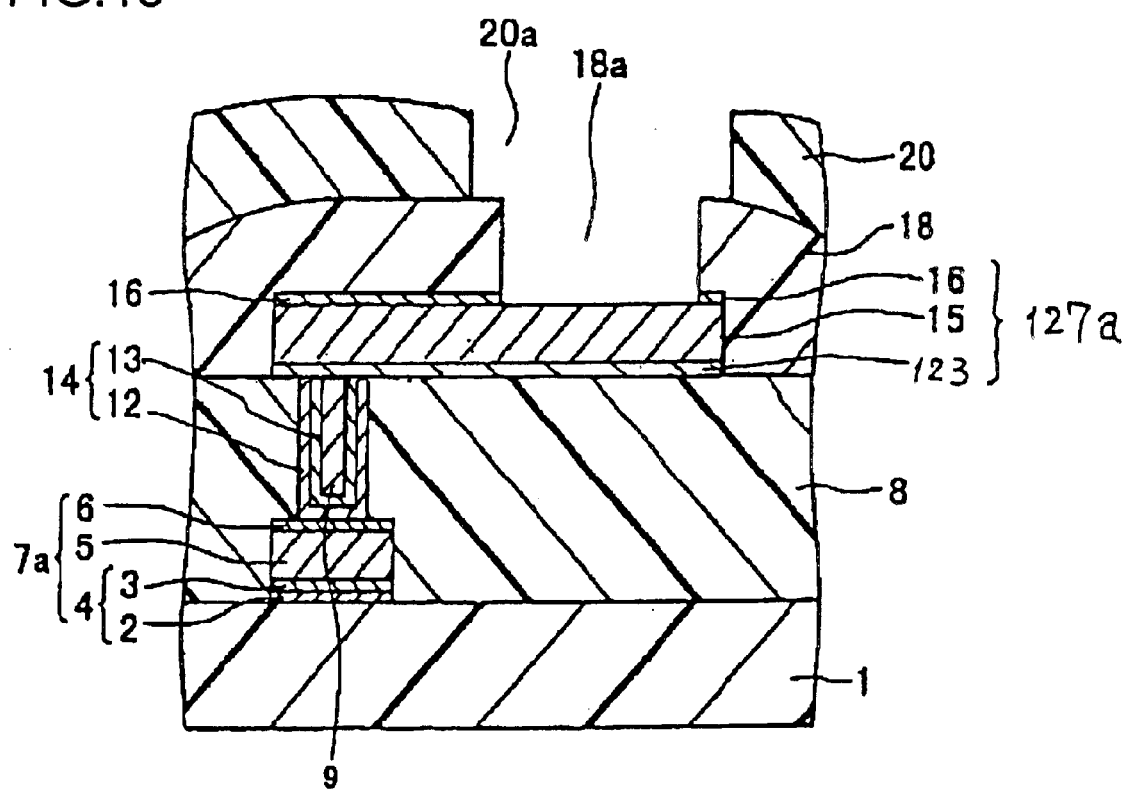
FIG. 15 is a cross-sectional view showing a semiconductor device according to a sixth embodiment of the present invention.
Figure 16:
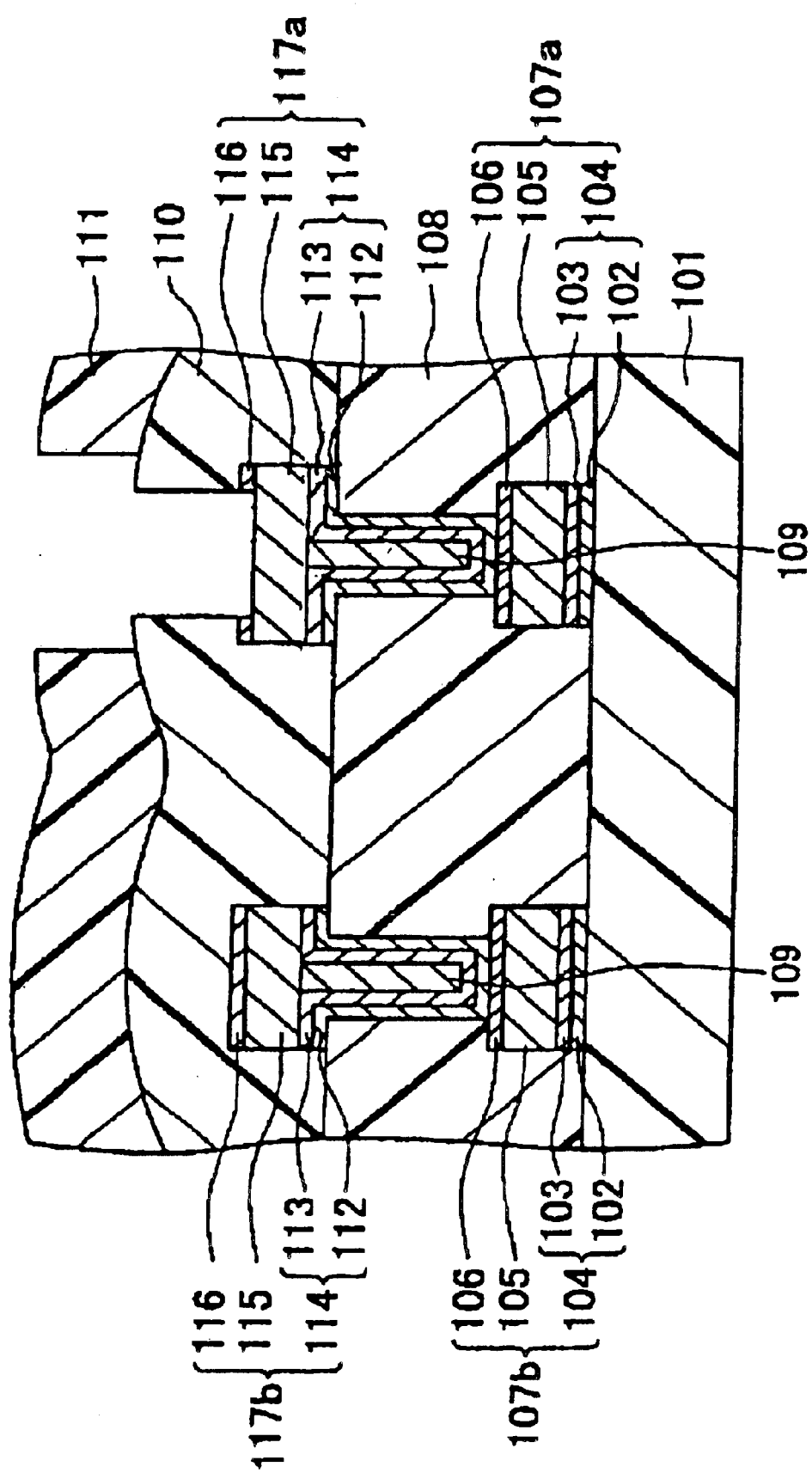
FIG. 16 is a cross-sectional view showing a conventional semiconductor device.

In the third embodiment, as is the case of the fourth embodiment, when the solid barrier metal layer 14 on the interlayer insulating film 8 is removed by using CMP so as to form the bonding pad layer 127a, the same effects as those in the first and the third embodiments can be obtained. A sixth embodiment of the present invention is the case described above, and a semiconductor device obtained in accordance with the sixth embodiment is shown in FIG. 15. The same reference numerals of the constituent elements shown in FIG. 7 designate the same constituent element in this embodiment. In this embodiment, the TiN film 123 is not always necessary.

In addition, the present invention is not limited to the embodiments described above, and various changes and modifications may be made without departing from the spirit and the scope of the present invention.

What is claimed is:

1. A semiconductor device comprising:
    a bonding pad portion provided on an insulating film;
    a passivation film provided on the bonding pad portion and the insulating film; and
    a pad opening portion provided in the passivation film at a position located on the bonding pad portion,
    wherein the bonding pad portion has a barrier metal layer and a conductive film provided on the barrier metal layer, and
    at least a part of the barrier metal layer located under the pad opening portion and between the insulating film and the conductive film is removed.

2. The semiconductor device according to claim 1, wherein the barrier metal layer comprises a Ti film and a TiN film provided thereon.

3. The semiconductor device according to claim 1, wherein the insulating film is a film made of a material comprising Si.

4. A semiconductor device comprising:
    an insulating film provided on a wire;
    a connecting hole provided in the insulating film at a position located on the wire;

a barrier metal layer provided in the connecting hole and on the insulating film;

a metal plug provided on the barrier metal layer in the connecting hole;

a conductive film provided on the metal plug and the barrier metal layer, the conductive film and the barrier metal layer forming a bonding pad portion;

a passivation film provided on the bonding pad portion and the insulating film; and a pad opening portion provided in the passivation film at a position located on the bonding pad portion, wherein at least a part of the barrier metal layer located under the pad opening portion and between the insulating film and the conductive film is removed.

5. The semiconductor device according to claim 4, wherein the pad opening portion is not located over the metal plug.

6. A semiconductor device comprising:

an insulating film provided on a wire;

a connecting hole provided in the insulating film at a position located on the wire;

a barrier metal layer provided in the connecting hole and on the insulating film;

a sidewall provided on the inside surface of the connecting hole with the barrier metal layer provided therebetween;

a conductive film provided on the sidewall, in the connecting hole, and on the barrier metal layer, the conductive film and the barrier metal layer forming a bonding pad portion;

a passivation film provided on the bonding pad portion and the insulating film; and a pad opening portion provided in the passivation film at a position located on the bonding pad portion, wherein the bonding pad portion is electrically connected to the wire via the conductive film, the sidewall, and the barrier metal layer, which are provided in the connecting hole, and at least a part of the barrier metal layer located under the pad opening portion and between the insulating film and the conductive film is removed.

7. A method for manufacturing a semiconductor device, comprising:

a step of forming a barrier metal layer on an insulating film;

a removing step of removing at least a part of the barrier metal layer located under a position at which a pad opening portion is to be formed;

a step of forming a conductive film on the barrier metal layer and the insulating film exposed by the removing step;

a step of patterning the conductive film and the barrier metal layer so as to form a bonding pad portion on the insulating film;

a step of forming a passivation film on the bonding pad portion and the insulating film; and a step of forming the pad opening portion in the passivation film at a position located on the bonding pad portion.

8. A method for manufacturing a semiconductor device, comprising:

a step of forming an insulating film on a wire;

a step of forming a connecting hole in the insulating film at a position located on the wire;

a step of forming a barrier metal layer in the connecting hole and on the insulating film;

a step of forming a metal film on the barrier metal layer and in the connecting hole;

a step of forming a metal plug in the connecting hole by removing the metal film present above the insulating film;

a removing step of removing at least a part of the barrier metal layer located under a position at which a pad opening portion is to be formed;

a step of forming a conductive film on the insulating film exposed by the removing step, the barrier metal layer, and the metal plug;

a step of patterning the conductive film and the barrier metal layer so as to form a bonding pad portion on the insulating film;

a step of forming a passivation film on the bonding pad portion and the insulating film; and a step of forming the pad opening portion in the passivation film at a position located on the bonding pad portion.

9. A method for manufacturing a semiconductor device, comprising:

a step of forming an insulating film on a wire;

a step of forming a connecting hole in the insulating film at a position located on the wire;

a step of forming a barrier metal layer in the connecting hole and on the insulating film;

a step of forming a sidewall on the inside surface of the opening portion with the barrier metal layer provided therebetween;

a removing step of removing at least a part of the barrier metal layer located under a position at which a pad opening portion is to be formed;

a step of forming a conductive film on the insulating film exposed by the removing step, on the barrier metal layer, and in the connecting hole;

a step of patterning the conductive film and the barrier metal layer so as to form a bonding pad portion on the insulating film;

a step of forming a passivation film on the bonding pad portion and the insulating film; and a step of forming the pad opening portion in the passivation film at a position located on the bonding pad portion.

10. A method for manufacturing a semiconductor device, comprising:

a step of forming an insulating film on a wire;

a step of forming a connecting hole in the insulating film at a position located on the wire;

a step of forming a barrier metal layer in the connecting hole and on the insulating film;

a step of forming a metal film on the barrier metal layer and in the connecting hole;

a step of forming a metal plug in the connecting hole by removing the metal film present above the insulating film;

a removing step of removing at least a part of the barrier metal layer located under a position at which a pad opening portion is to be formed;

a step of forming a conductive film on the insulating film exposed by the removing step, the barrier metal layer, and the metal plug;

a step of patterning the conductive film and the barrier metal layer so as to form a bonding pad portion on the insulating film;

a step of forming a passivation film on the bonding pad portion and the insulating film; and a step of forming the pad opening portion in the passivation film at a position which is located on the bonding pad portion and which is not located over the metal plug.

11. A method for manufacturing a semiconductor device, comprising:

a step of forming an insulating film on a wire;

a step of forming a connecting hole in the insulating film at a position located on the wire;

a step of forming a barrier metal layer in the connecting hole and on the insulating film;

a step of forming a metal film on the barrier metal layer and in the connecting hole;

a removing step of removing the metal layer and the barrier metal layer present on the insulating film so as to form a metal plug in the connecting hole;

a step of forming a conductive film on the insulating film exposed by the removing step and the metal plug;

a step of patterning the conductive film so as to form a bonding pad portion on the insulating film;

a step of forming a passivation film on the bonding pad portion and the insulating film; and a step of forming a pad opening portion in the passivation film at a position located on the bonding pad portion.

12. The method for manufacturing a semiconductor device according to claim 11, wherein the bottom layer forming the conductive film is not made of a Ti film.

13. A method for manufacturing a semiconductor device, comprising:

a step of forming an insulating film on a wire;

a step of forming a connecting hole in the insulating film at a position located on the wire;

a step of forming a barrier metal layer in the connecting hole and on the insulating film;

a step of forming a sidewall on the inside surface of the opening portion with the barrier metal layer provided therebetween;

a removing step of removing the barrier metal layer present on the insulating film;

a step of forming a conductive film on the insulating film exposed by the removing step and in the connecting hole;

a step of patterning the conductive film so as to form a bonding pad portion on the insulating film;

a step of forming a passivation film on the bonding pad portion and the insulating film; and a step of forming a pad opening portion in the passivation film at a position located on the bonding pad portion.

14. A method for manufacturing a semiconductor device, comprising:

a step of forming an insulating film on a wire;

a step of forming a connecting hole in the insulating film at a position located on the wire;

a step of forming a barrier metal layer in the connecting hole and on the insulating film;

a step of forming a metal film on the barrier metal layer and in the connecting hole;

a removing step of removing the metal layer and the barrier metal layer present on the insulating film so as to form a metal plug in the connecting hole;

a step of forming a conductive film on the insulating film exposed by the removing step and the metal plug;

a step of patterning the conductive film so as to form a bonding pad portion on the insulating film;

a step of forming a passivation film on the bonding pad portion and the insulating film; and a step of forming a pad opening portion in the passivation film at a position which is located on the bonding pad portion and is not located over the metal plug.

15. A semiconductor device comprising:

a bonding pad portion provided on an insulating film;

a passivation film provided on the bonding pad portion and the insulating film; and a pad opening portion provided in the passivation film at a position located on the bonding pad portion, wherein the bonding pad portion has a barrier metal layer and a conductive film provided on the barrier metal layer, and at least a part of an area located under the pad opening portion and between the insulating film and the conductive film is free of the barrier metal layer.

\* \* \* \* \*